United States Patent
Finarov et al.

(10) Patent No.: US 6,833,048 B1
(45) Date of Patent: Dec. 21, 2004

(54) APPARATUS FOR IN-CASSETTE MONITORING OF SEMICONDUCTOR WAFERS

(75) Inventors: Moshe Finarov, Rehovot (IL); Rani Kipper, Mazkeret Batya (IL)

(73) Assignee: Nova Measuring Instruments Ltd., Rehovot (IL)

( * ) Notice: Subject to any disclaimer, the term of this patent is extended or adjusted under 35 U.S.C. 154(b) by 0 days.

(21) Appl. No.: 10/110,312

(22) PCT Filed: Oct. 6, 2000

(86) PCT No.: PCT/IL00/00630

§ 371 (c)(1),
(2), (4) Date: Aug. 27, 2002

(87) PCT Pub. No.: WO01/27975

PCT Pub. Date: Apr. 19, 2001

(30) Foreign Application Priority Data

Oct. 11, 1999 (IL) .................................................. 132314

(51) Int. Cl.⁷ .......................... C23F 1/00; H01L 21/306; B65G 49/07
(52) U.S. Cl. .................. 156/345.24; 118/715; 414/935; 414/940; 204/298.03
(58) Field of Search ....................... 156/345.13, 345.24, 156/345.31, 345.23; 118/719; 414/935–941

(56) References Cited

U.S. PATENT DOCUMENTS

| | | | |
|---|---|---|---|
| 4,977,853 A | * 12/1990 | Falcoff et al. | 118/665 |
| 5,211,795 A | * 5/1993 | Yoshida et al. | 156/345.31 |
| 5,474,647 A | * 12/1995 | Poultney et al. | 438/5 |
| 5,604,344 A | 2/1997 | Finarov | |
| 5,682,242 A | 10/1997 | Eylon | |
| 5,933,521 A | 8/1999 | Pasic | |
| 5,948,203 A | 9/1999 | Wang | |
| 5,988,971 A | * 11/1999 | Fossey et al. | 414/416.01 |
| 6,004,047 A | * 12/1999 | Akimoto et al. | 396/604 |
| 6,338,005 B1 | * 1/2002 | Conboy et al. | 700/213 |

FOREIGN PATENT DOCUMENTS

| | | |
|---|---|---|
| EP | 0 898 300 A2 | 2/1999 |
| WO | WO 92/05920 A1 | 4/1992 |

* cited by examiner

*Primary Examiner*—Parviz Hassanzadeh
*Assistant Examiner*—Karla Moore
(74) *Attorney, Agent, or Firm*—Browdy and Neimark, P.L.L.C.

(57) ABSTRACT

A processing apparatus is presented for applying to a substantially flat workpiece contained in a cassette, and a processing tool coupled to the housing. The processing tool is displaceable along three mutually perpendicular axes relative to the cassette for inserting the tool into the gap and moving the tool inside the gap relative to the workpiece. The processing apparatus can be utilized in chemical mechanical polishing arrangement, photolithography arrangement, and CVD arrangement.

22 Claims, 5 Drawing Sheets

APPARATUS FOR IN-CASSETTE MONITORING OF SEMICONDUCTOR WAFERS

FIELD OF THE INVENTION

This invention is generally in the field of optical monitoring techniques, and relates to an apparatus for monitoring parameters of workpieces being contained in a cassette. The invention is particularly useful in the manufacture of semiconductor devices for metrology/inspection of wafers progressing on a production line.

BACKGROUND OF THE INVENTION

The wafers' manufacture always includes the inspection of wafers after various manufacturing steps, for example after photolithography and chemical mechanical planarization (CMP). Wafers progressing on a production line between various processing tools are located in load and unload cassettes, each cassette containing a number of wafers, usually 25 of 200 mm-diameter wafers. To inspect a specific wafer prior to or after its processing by a specific tool, the wafer should be taken out of, respectively, the load or unload cassette, and brought to an inspection tool, either by an operator or by a robot depending on the kind of the inspection tool used, namely a stand-alone station or an integrated tool (i.e., located within the processing environment).

FIGS. 1a and 1b illustrate (by the way of a block diagram) two different examples of inspecting wafers progressing on a production line, typically employed in FABs.

FIG. 1a exemplifies the part of a production line $PL^{(A)}$, for example associated with photolithography environment containing a phototrack 2, a load cassette 3a, an unload cassette 3b and a robot R which transfers wafers between the photolithography tools. An inspection tool 4a, such as a Scanning Electron Microscope (SEM), is accommodated outside the production line $PL^{(A)}$ as a stand-alone machine. A wafer W to be inspected is brought (handled) to the machine 4 by an operator or robot P, and may then be returned to the production line $PL^{(A)}$.

FIG. 1b illustrates another part of a production line $PL^{(B)}$, for example associated with a CMP tool 6. Here, an integrated inspection tool 4b is used, for example ITM NovaScan 210 model commercially available from Nova Measuring Instruments Ltd, Israel. A robot R supplies a specific wafer W to the tool 4b and brings the wafer to the unload cassette 3b.

Thus, regardless of whether the stand-alone or integrated inspection tool is used, additional handling of the wafer to be inspected is typically required. Needless to say that the handling of such delicate workpieces as wafers May cause damage to the workpiece and should therefore be avoided. It is especially important in processing wafers of large size, like 300 mm-diameter wafers.

SUMMARY OF THE INVENTION

There is accordingly a need in the art to facilitate the inspection/measurement of workpieces progressing along a production line, by providing a novel monitoring apparatus capable of being applied to the workpiece contained in a cassette.

It is a major feature of the present invention to provide such an apparatus whose orientation with respect to the cassette is adjustable in a manner to apply the apparatus to a selected one in a plurality of workpieces contained in the cassette, and to enable scanning of the workpiece.

It is a further feature of the present invention to provide such an apparatus, whose dimensions allow its use as an integrated tool.

The main idea of the present invention is based on the following. Semiconductor wafers are typically kept in a cassette having a plurality of vertically aligned spaced-apart parallel slot-like compartments. Each compartment contains a corresponding one of the wafers in a lot, and a certain gap is typically provided in the slot-like compartment above the upper surface of the wafer contained therein. Thus, in an inspection tool according to the present invention, a probe, which is to be positioned above the wafer during inspection, is designed like an arm insertable into the gap and driven for movement relative to the wafer under inspection. To this end, the probe supporting an optical head is mounted for movement along three mutually perpendicular axes.

Generally, such a monitoring apparatus can be applied to any substantially flat workpiece contained in a cassette, provided a certain gap exists inside the cassette above the workpiece. Moreover, such an apparatus may be any processing tool, e.g., cutting tool or marker, provided the gap size is sufficient for processing the workpiece with this tool.

There is thus provided according to one aspect of the present invention a processing apparatus for applying to a substantially flat workpiece contained in a cassette having a gap thereinside above said workpiece, the apparatus comprising a housing located outside said cassette and a processing tool coupled to the housing, wherein the processing tool is displaceable along three mutually perpendicular axes relative to the cassette for inserting the tool into the gap and moving the tool inside the gap relative to said workpiece.

To provide the above movements of the tool, the apparatus comprises at least one translation assembly. Preferably, the translation assembly guides the movement of the tool along the three axes relative to the housing. However, the construction can be such that a first translation assembly guides the movement of the tool along the two axes relative to the housing, and a second translation assembly guides the movement of the tool along the third axis relative to the cassette, or, alternatively, guides the movement of the housing together with the tool.

Preferably, the processing tool is displaceable between its inoperative position projecting from the housing and an operative position being retracted towards the housing. In the inoperative position of the processing tool, it may be located substantially inside the housing or be folded so as to extend along an outer surface of a sidewall of the housing.

The construction may be such that the processing tool is supported on a single-arm structure projecting from the housing, and this arm is displaceable along the three axes. Alternatively, the processing tool may be supported on a multiple-link kinematic structure, a so-called "frog-legs", pivotal movements of one or more links providing the displacement of the tool along one or two axes. These pivotal movements may provide the displacement of the tool between its operative position projecting from the housing and an inoperative position being retracted towards the housing.

According to another aspect of the present invention, there is provided an optical monitoring apparatus for monitoring parameters of a substantially flat workpiece contained in a cassette having a gap thereinside above said workpiece, the apparatus comprising a measuring unit located outside said cassette and an optical head carried by a conveyor arm coupled to the measuring unit, the conveyor arm conveying the optical head along three mutually perpendicular axes relative to the cassette so as to insert the optical head into the gap and moving the head inside the gap relative to said workpiece.

The term "monitoring" used herein signifies determining predetermined characteristics of the workpiece by measurements, inspection or metrology technique.

According to yet another aspect of the present invention, there is provided a processing station for processing a substantially flat workpiece which arrives to or leaves the station in a cassette having a gap thereinside above the workpiece, the station comprising processing environment and an optical monitoring apparatus for monitoring the workpiece whilst inside the cassette.

According to some more aspects of the present invention, there are provided an CMP arrangement, a photolithography arrangement and an CVD arrangement, respectively, for processing semiconductor wafers, which utilize a monitoring apparatus for monitoring parameters of the wafers being contained in a cassette having a gap thereinside above the wafer.

More specifically, the present invention is used for monitoring semiconductor wafers (constituting a substantially flat workpiece) with an optical monitoring apparatus (constituting a processing tool) for determining thickness parameters of one or more wafer's layers, and is therefore described below with respect to this application.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF PREFERRED EMBODIMENTS

Figure 1A:
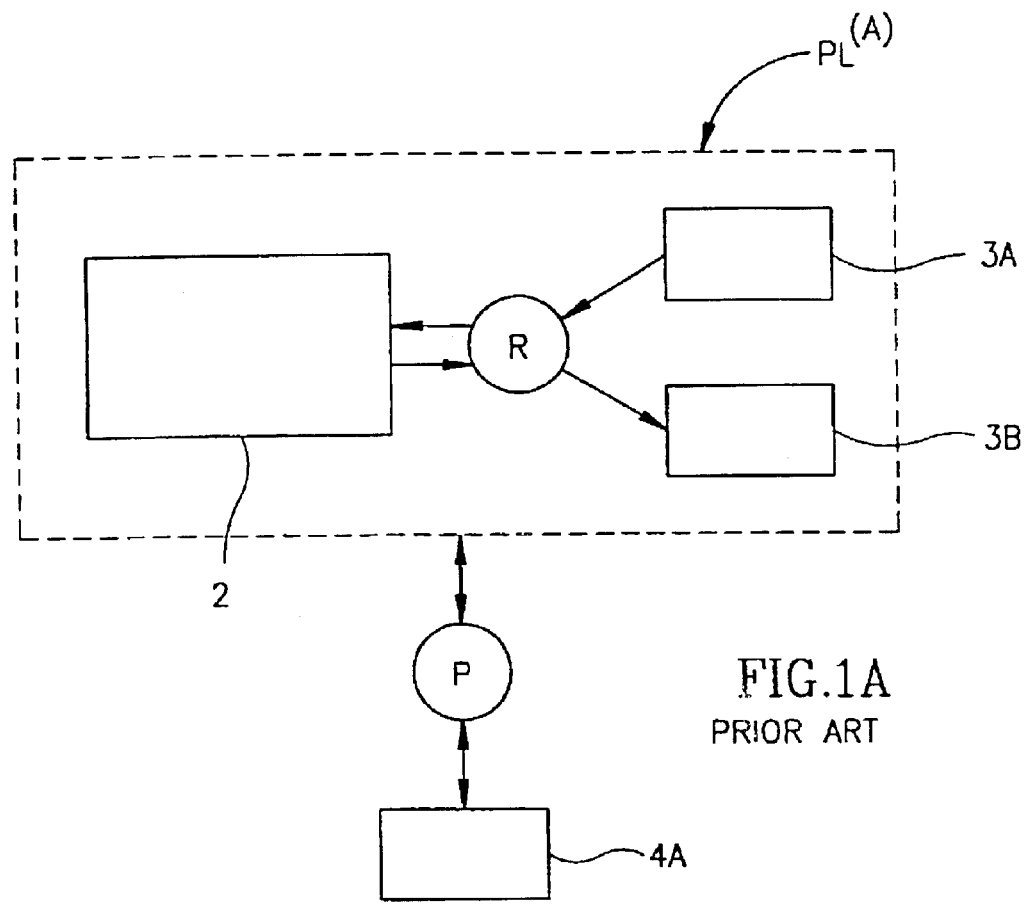
FIGS. 1a and 1b schematically illustrate two conventional systems used in the manufacture of semiconductor devices, which utilize, respectively, a stand-alone monitoring device and an integrated monitoring tool.
Figure 1B:
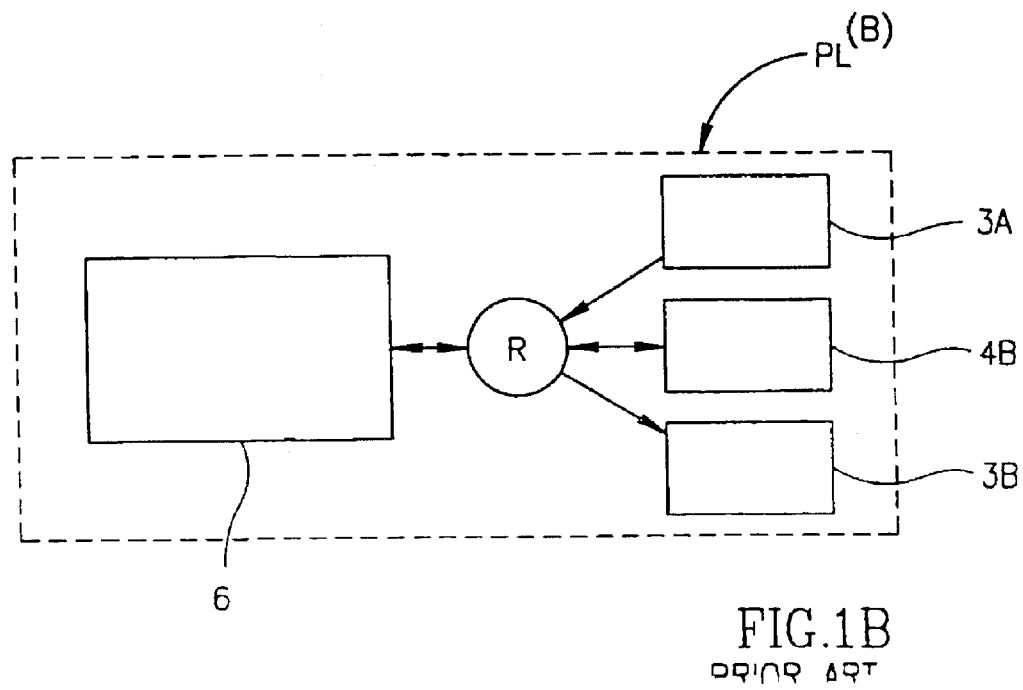

FIG. 1a illustrates a conventional photolithography tools arrangement and a stand-alone SEM associated with this arrangement. FIG. 1b illustrates a conventional CMP tools arrangement utilizing an integrated inspection tool such as ITM NovaScan 210 model commercially available from Nova Measuring Instruments Ltd., Israel. As indicated above, the conventional inspection tools, either for off-line or for integrated application, always require additional handling of wafers, in addition to that required for translating the wafers between the tools of a specific processing station.

Figure 2A:
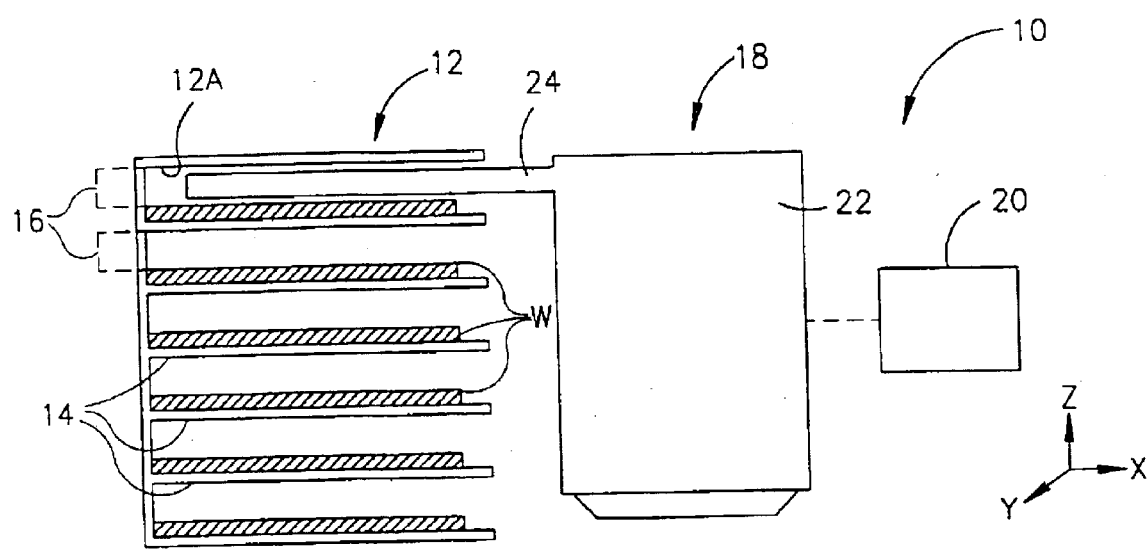
FIGS. 2a and 2b schematically illustrate the main principles of monitoring apparatus according to the invention, showing the apparatus in its operative and inoperative positions, respectively.
Figure 2B:
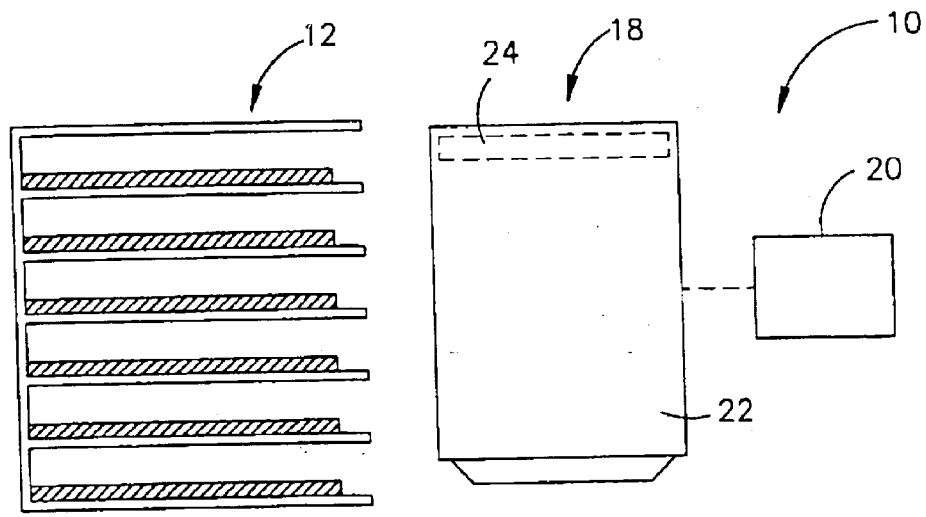

Referring to FIGS. 2a and 2b, there are illustrated the main constructional features of a monitoring apparatus 10 according to the invention. The apparatus 10 is intended for monitoring the parameters of wafers W contained in a cassette 12 (such as cassettes 3a and 3b in FIGS. 1a-1b). As shown, the cassette 12 has several spaced-apart slot-like compartments—six slots in the present example, generally at 14, each containing the corresponding wafer W. A certain small gap 16 exists between two adjacent wafers (typically 10 mm for a 300 mm-diameter wafer).

The monitoring apparatus 10 includes such main constructional parts as a measuring unit 18 and a control unit 20, whose input is coupled (by wires or wireless) to the output of the measuring unit 18. The measuring unit 18 is contained in a housing 22 formed with a substantially flat, arm-like member 24 (constituting a conveyor arm). It should be noted, although not specifically shown, that the measuring and control units 18 and 20 could be accommodated in the common housing 22.

As shown in FIG. 2a, in an operative position of the apparatus 10, the arm 24 projects from the housing 22 and is insertable into the gap 16. When in an inoperative position of the apparatus 10, the arm 24 is retracted towards the housing, for example to be located inside the housing 22 (FIG. 2b).

Figure 2C:
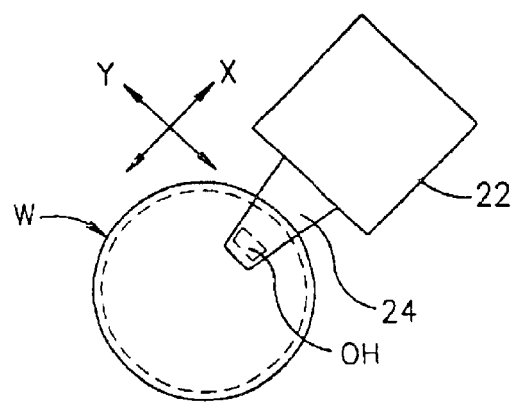
FIG. 2c more specifically illustrates an optical arm of the monitoring apparatus in its operative position.

FIG. 2c illustrates the selected wafer W to be monitored and the arm 24 positioned above the wafer W in the X-Y plane. The arm 24 serves as an "optical arm" carrying an optical head OH in a manner allowing the illumination of a region on the wafer W with incident radiation and collection of radiation returned (reflected) from the illuminated region.

The optical arm 24 is mounted for movement along X-, Y- and Z-axes relative to the cassette by means of a suitable translation assembly, as will be described more specifically further below with reference to FIGS. 4 and 5. The displacement of the optical arm 24 along the Z-axis enables to adjust the vertical position of the arm 24 to be applied to a selected wafer, namely to be inserted into the gap 16 above the selected wafer W. By displacing the optical arm 24 in the X-Y plane, measurements of successive regions (measurement sites) on the selected wafer can be performed. Thus, the optical arm conveys the optical head towards the selected wafer, and, after being inserted into the gap inside the corresponding slot, conveys the optical head within an inspection (monitoring) plane above the wafer.

Figure 3:
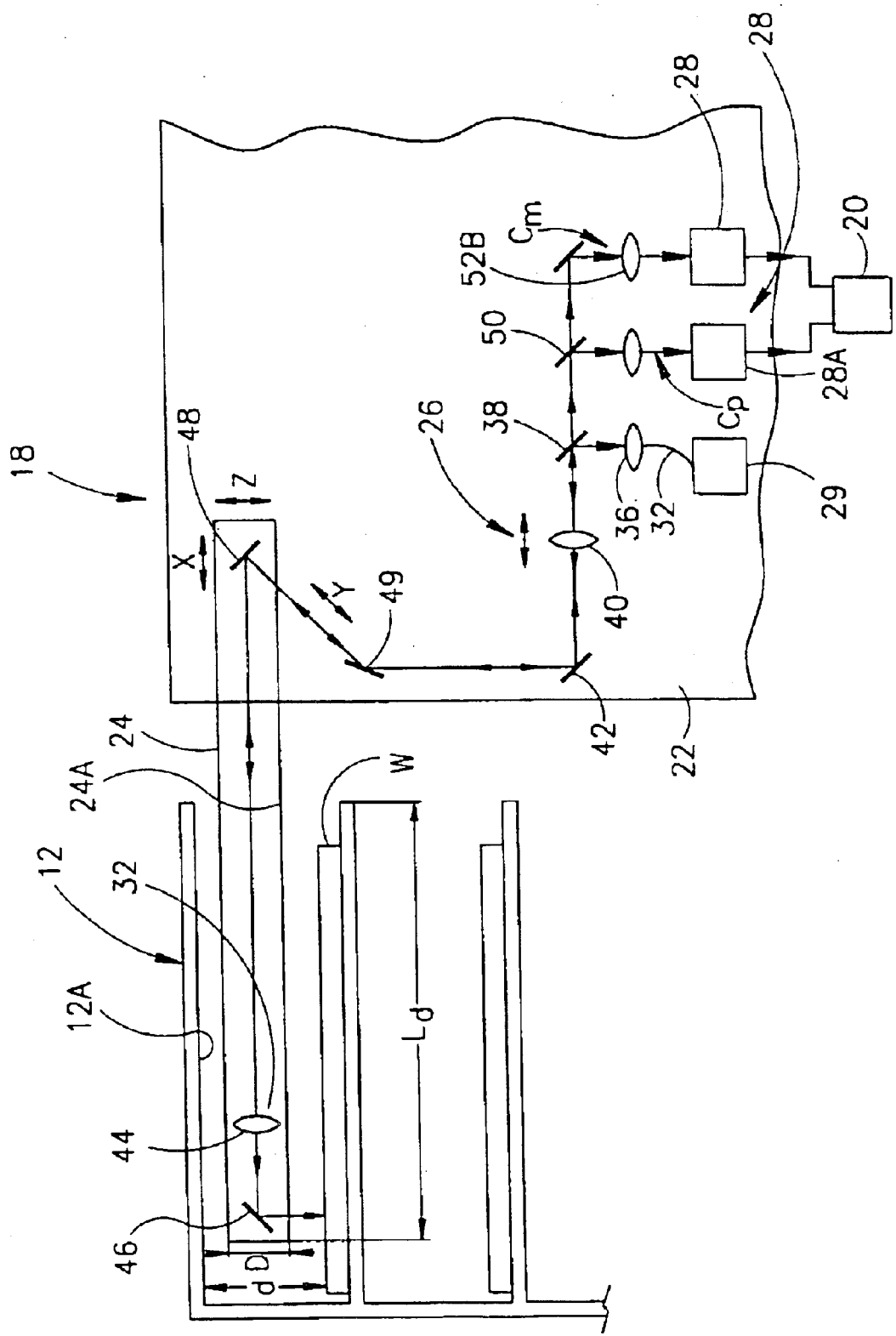
FIG. 3 schematically illustrates the main components of a measuring unit in the apparatus of FIG. 2.

Turning now to FIG. 3, the construction of the measuring unit 18 is more specifically illustrated. The measuring unit 18 provides spectrophotometric measurements, which are commonly used for measuring the thickness and optical properties of thin films in different processes of semiconductors' manufacturing. The measuring unit 18 includes an optical system 26 and a detection assembly 28. The optical system 26 is composed of a radiation source 29, a radiation directing arrangement and an optical head 32. As shown, the detection assembly 28 and almost all the elements of the optical system 26 are accommodated in the housing 22, except for the optical head 32 which is mounted on the arm 24.

It should be noted that, in the present example, the optical head 32 (or a corresponding part thereof) is mounted on an outer surface of the optical arm 24. The optical head, however, may be mounted inside the arm 24, provided the latter is formed with an appropriate optical window.

The optical system 26 and the detection assembly 28 are constructed generally similar to those of the above-mentioned metrology tool ITM NovaScan 210, except for additional movable mirrors, which convey incident and returned light between the optical elements accommodated in the housing 22 and the optical head accommodated in the arm 24. Light from the light source 29 passes through an optical fiber 34 (the provision of which is optional) and a condenser 36 that directs the light onto a beam splitter 38, which, in turn, reflects the light onto a tube lens 40 and a mirror 42. The optical head 32 is formed by an objective lens 44 and a mirror 46 that directs incident light onto the surface region of the wafer W, and directs light returned from this region towards the objective lens 44. Additional movable mirrors 48 and 49 are provided for conveying incident and returned light between the optical head 32 and the mirror 42. Since the operation of each of these optical elements is known per se, the light propagation is shown here schematically in order to facilitate illustration of the main components of the apparatus.

The light beam reflected from the illuminated region and collected by the optical head 32 propagates towards the beam splitter 38, and, after passing therethrough, impinges onto a pinhole mirror 50, which directs light to the detection assembly 28. More specifically, the pinhole mirror 50 reflects the periphery region of the light beam towards a CCD camera 28a through an imaging lens 52a, and transmits the central region of the light beam towards a spectrophotometer 28b through a lens 52b. The provision of the pinhole mirror 50 divides the entire optical path of the collected light into measurement and positioning channels $C_m$ and $C_p$ associated, respectively, with the spectrophotometer and CCD camera.

The ability for translation of the optical arm 24 along the Z-axis enables to bring the optical arm to any selected wafer, while the ability for translation of the arm along the X- and Y-axes enables to bring the optical head to a desired location on the wafer inside the cassette 12. It should be noted that, generally, a pivotal movement of the arm within the X-Y-plane can also be provided, for example to reduce the footprint of the system along at least one of the X- or Y-axis.

Figure 4:
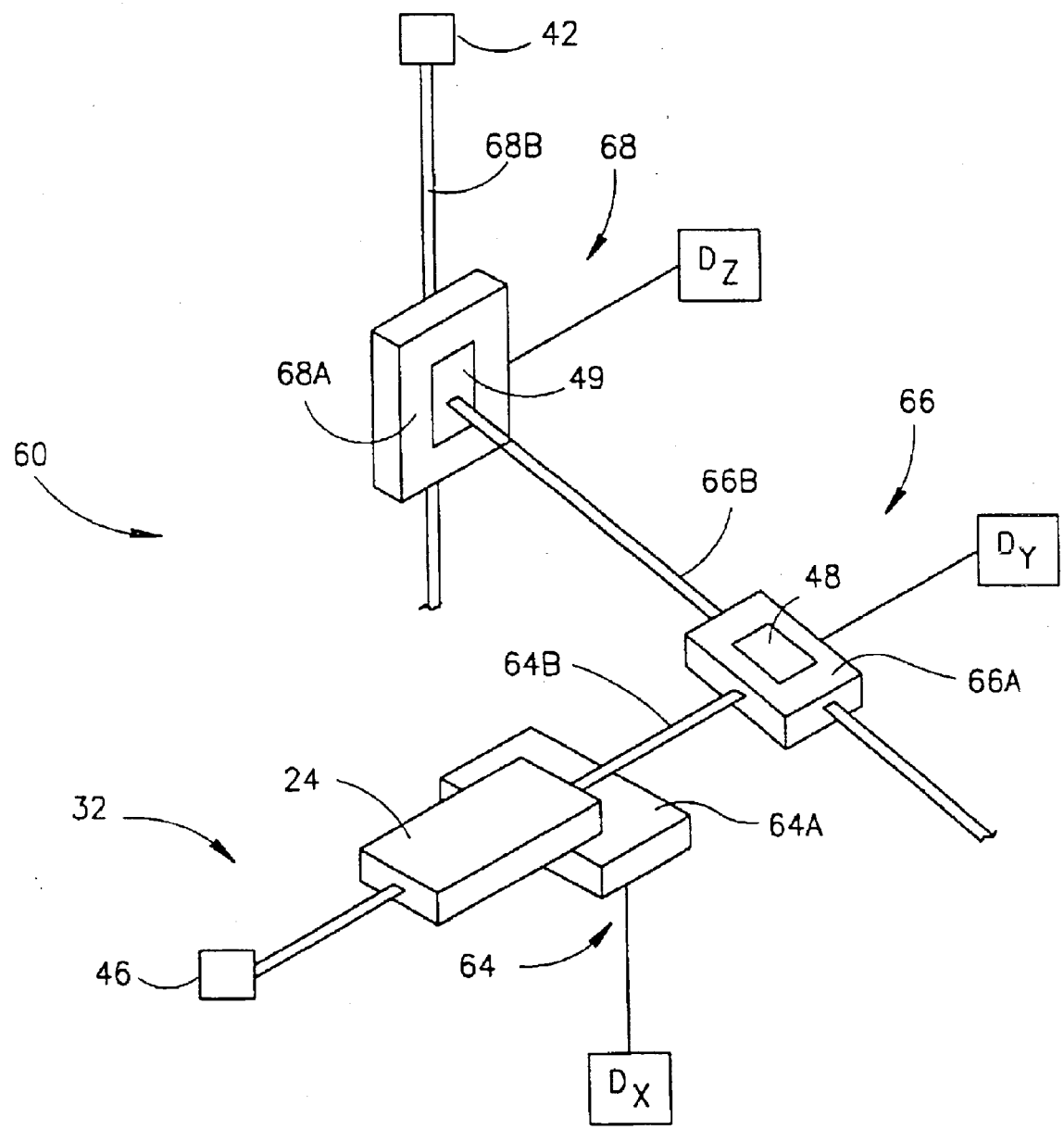
FIG. 4 more specifically illustrates a translation assembly suitable to be used in the monitoring apparatus of FIGS. 2a and 2b.

FIG. 4 illustrates one possible example of a translation assembly, generally designated 60, suitable to be used in the monitoring apparatus 10 for guiding the movements of the optical arm along the X-, Y- and Z-axes. The translation assembly 60 actually presents X-Y-Z stage, or the so-called "Cartesian Supporting System". In the present example, the translation assembly 60 is composed of three single axis motion systems 64, 66 and 68 responsible for the movements of the optical arm 24 along the X-, Y- and Z-axes, respectively. As shown, the systems 64, 66 and 68 include base-and-guide arrangements (stages), associated with drives $D_X$, $D_Y$ and $D_Z$, respectively. The arm 24 (carrying the mirror 46) is mounted on a base 64a for movement along a guide 64b (X-axis), which is coupled to a base 66a. The latter carries the mirror 48 and is driven for sliding movement along a guide 66b (Y-axis). The guide 66b is, in turn, coupled to a base 68a carrying the mirror 49 and mounted for movement along a guide 68b (Z-axis) towards and away from the stationary mounted mirror 42.

Figure 5B:
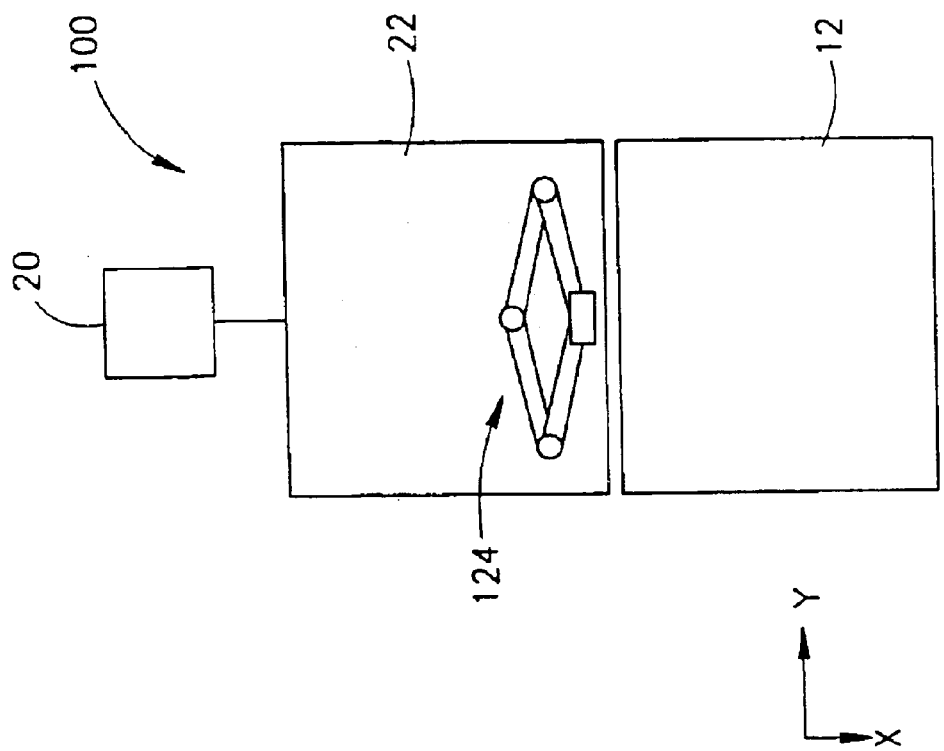
FIGS. 5a and 5b illustrate another embodiment of an optical arm in operative and inoperative positions, respectively, of a monitoring apparatus.
Figure 5A:
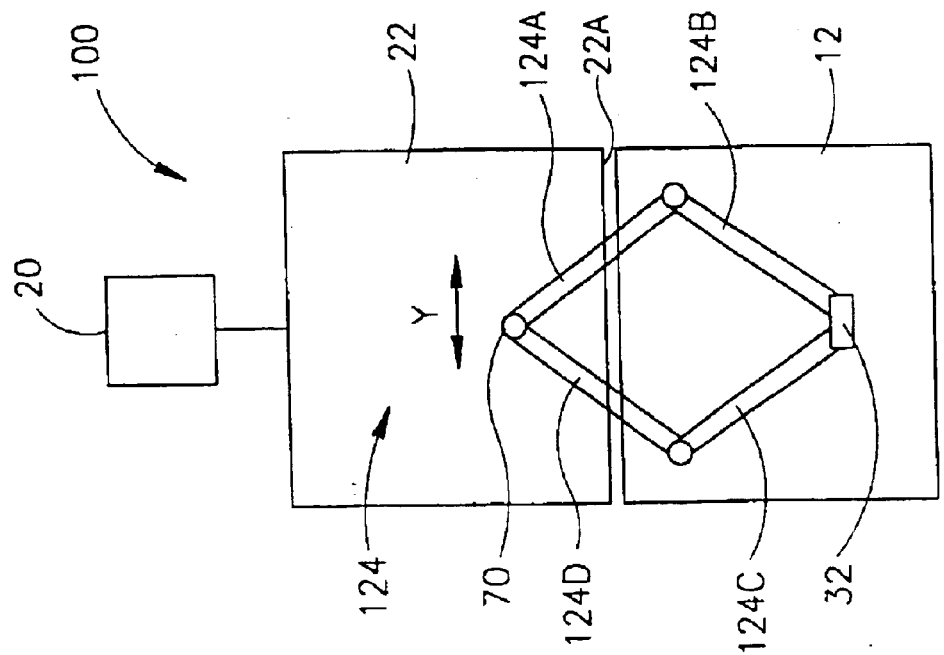

FIGS. 5a and 5b illustrate operative and inoperative positions, respectively, of a monitoring apparatus 100, which is constructed generally similar to the apparatus 10, but has somewhat different design of an optical arm 124 and a translation assembly (not shown). To facilitate understanding, same reference numbers are used for identifying those components, which are identical in the apparatuses 10 and 100. Here, the optical arm 124 is in the form of a so-called "frog-legs" structure having four links 124a, 124b, 124c and 124d. The optical arm 124 is operated by a driving mechanism 70 that drives it between its operative, extended ("open") position (FIG. 5a) and an inoperative, retracted ("closed") position (FIG. 5b). In the present example, the structure 124, when in the inoperative position, is located inside the housing 22. It should, however, be noted that the structure 124, whilst being in its "closed" position may be located outside the housing 22 being retracted to its outer surface 22a. The structure 124 is movable along the surface 22a (along the Y-axes), and by "opening" such a frog-legs structure, the movement of the optical head 32 along the X-axis is provided, thereby enabling the penetration of the optical head 32 into the gap inside the cassette 12. The movement along the Z-axis can be achieved either by providing a translation means for guiding the movement of the entire structure 124 relative to the housing 22, or by providing the vertical movement of the entire housing 22 relative to the cassette. It should be understood that the provision of the "frog-legs" structure may reduce the system's footprint along the X-axis, and could therefore meet the requirements of a specific application.

Turning back to FIG. 3, the penetration depth $L_d$ of the optical arm (24 or 124) between the two adjacent wafers is determined by the linear field of view F of the objective lens 44 for a given value of the gap 16 between the adjacent wafers. It is known that the beam's width D (i.e., the height of the optical arm), after passing the distance $L_d$ from the objective lens 44 (keeping in mind that the object plane, i.e., the wafer's surface, is located in the focal plane of the objective lens 44) is determine as follows:

$$D \approx 2 \cdot f \cdot NA + \frac{F \cdot L_d}{f}$$

wherein NA is the numerical aperture of the objective lens, and f is the focal length of the objective lens. Since the height D of the optical head should be less than the distance d between two vertically adjacent wafers, the penetration depth $L_d$ of the optical head should satisfy the following condition:

$$D = \left(2 \cdot f \cdot NA + \frac{F \cdot L_d}{f}\right) \leq d$$

From the above equation, the penetration depth $L_d$ can be determined for the actual values of the distance d and linear field of view F. For example, let us consider the following conditions: $d_1$=6 mm and $d_2$=10 mm for, respectively, 200 mm and 300 mm wafers; f=20 mm; F=0.5 mm and NA=0.1 (a sufficient value for pattern recognition and spectrophotometric measurements in the case of thin films measurements). The corresponding values of the penetration depth are: $L_d^{(1)}$=80 mm and $L_d^{(2)}$=120 mm. Hence, different measuring sites within the measured wafer can be accessed. In many cases, e.g., after CVD or other deposition process, access to part of the wafer may be sufficient for the in-line process control. However, for some processes, e.g., CMP, access to the entire wafer's surface is needed.

The two main functions of the measuring unit includes positioning of the optical head 32 (including focusing, image acquisition and image processing) by the positioning channel $C_p$, and measuring (including illumination and detection) by the measuring channel $C_m$. The operation of the positioning channel is aimed at identifying the exact location of the selected wafer and the measurement site thereon to be currently measured. After the completeness of this operational step, the optical arm 24 is brought into such a position that enables the measuring channel to take measurements, after the required focus is achieved. Alternatively, the pattern recognition can first be performed with the field of view F=0.5 mm at a region on the wafer close to its edge. This area is limited to the depth of penetration $L_d$, and is predetermined by the wafer's specific pattern. For spectrophotometric measurements, the field of view not exceeding 20 $\mu$m is typically needed, which results in the penetration depth being less than 500 mm. Once the pattern recognition is complete, measurements can be taken at any site on the wafer, as far as the relative location of the site relative to the identified pattern can be determined.

Thus, the monitoring apparatus constructed according to the invention operates in the following manner. First, either a load/unload cassette is placed (by a robot or by an operator) in a measuring position with respect to the monitoring apparatus, or the apparatus is brought to the measuring position. For example, the housing of the monitoring apparatus may be provided with a translation means, e.g., wheels. Then, the respective drive mechanism is operated for moving the optical arm so as to penetrate inside the gap between the adjacent wafers, wherein the lowermost of these wafers is a selected one to be measured. The positioning of the arm is performed in accordance with a recipe design and known pattern recognition algorithms, for example in a manner disclosed in U.S. Pat. No. 5,682,242 assigned to the assignee of the present application. Alternatively, an alignment feature can be chosen during the recipe preparation. This should be any asymmetrical feature, which is always found in the area that can be scanned by the optical arm, irrespectively of the orientation of the wafer. The position of a measurement site is determined relative to the alignment feature. Then, the optical arm scans a portion on the wafer and a processor of the control unit "looks" for the alignment feature within this portion. This can be done by any known suitable technique such as correlation, by which various orientations of the image of the alignment feature stored in the control unit are compared to the image from the scanned portion. If the alignment feature was not found, the optical arm moves to a next portion and the process is repeated until the alignment feature is identified on the wafer. At this point, the control unit operates the optical head movement to a predetermined location relative to the alignment feature in order to reach the measurement site. By this, the positioning is complete, and measurements are taken and processed. It should be noted that, in this specific example, where the processing of workpieces is optical monitoring and the workpieces are semiconductor wafers, the measurement unit as well as the optical arm should not interfere with the wafers and with the load/unload cassette or introduce any potential risk of contamination.

Moreover, different techniques of dynamic or static auto-focusing may be applied during the wafer imaging, for example in a manner disclosed in U.S. Pat. No. 5,604,344 assigned to the assignee of the present application. After measuring of the actual out-of-focus distance, it may be adjusted for example, either by moving the lens 40, acting simultaneously for $C_p$ and $C_m$ channels, or by moving sensors 28a and 28b separately.

The advantages of the present invention are thus self-evident. The monitoring apparatus can be tiny, having sufficiently small footprint to be physically installed inside the processing environment, when its use as an integrated inspection tool is required. The apparatus has a narrow optical arm that can be freely inserted into the gap between two adjacent wafers and measure and/or scan at least one die of the wafer. Thus, the wafer is monitored whilst being located inside the cassette, thereby avoiding additional handling of the wafer. This facilitates the installation, integration and operation of the apparatus and of that station of the production line (processing environment) with which the apparatus is used.

The monitoring apparatus according to the invention can be used with any processing tool arrangement, either as an integrated tool or as a stand-alone review station, as well as with CVD or PVD processing environment for thickness measurements. The films on CVD/PVD wafers are usually highly uniform. Thus, the thickness measurement in a single site of such wafers is sufficient to estimate the layer thickness on the wafer. To this end, the optical arm is designed so as to be capable of arriving to a first die proximate to the wafer's edge. However, multiple sites over the wafer can be measured as well providing mapping of the entire wafer.

Those skilled in the art will readily appreciate that many modifications and changes may be applied to the invention as hereinbefore exemplified without departing from its scope, as defined in and by the appended claims.

What is claimed is:

1. A monitoring apparatus for applying to a substantially flat workpiece contained in a cassette in a manner defining a gap thereinside above each workpiece, the apparatus comprising: a housing having a projecting arm for supporting a monitoring head on a distal end thereof and displacing the monitoring head along three mutually perpendicular axes with respect to the housing, the monitoring head being configured and operable to determine at least one parameter of the workpiece, the distal end of the arm and the monitoring head being configured so as to be insertable into the gap and being operable to move within said gap relative to the respective workpiece, to thereby provide data indicative of the at least one parameter of said workpiece, while inside the cassette.

2. The apparatus according to claim 1, wherein said housing comprises a translation assembly for guiding the movement of the monitoring head along the three axes relative to the housing.

3. The apparatus according to claim 2, wherein said translation assembly comprises three axial motion systems, each responsible for the movement of the monitoring head along a corresponding one of the three axes.

4. The apparatus according to claim 1, wherein said housing is provided with a first translation assembly responsible for the movements of the monitoring head along the two axes, respectively, relative to the housing and a second translation assembly for moving the housing along the third axis.

5. The apparatus according to claim 1, wherein said monitoring head is displaceable between its operative position projecting from the housing and an inoperative position being retracted towards the housing.

6. The apparatus according to claim 5, wherein the monitoring head, when in the inoperative position thereof, is located substantially inside the housing.

7. The apparatus according to claim 1, wherein said monitoring head is supported on a multiple-link kinematic chain structure, pivotal movements of the structure's links providing the displacement of the head along the two axes.

8. The apparatus according to claim 7, wherein said pivotal movements of the links provide displacement of the monitoring head between its operative position projecting from the housing and an inoperative position being retracted towards the housing.

9. The apparatus according to claim 1, wherein said monitoring includes optical monitoring of the workpiece, the monitoring head being an optical head associated with a unit accommodated inside the housing and operable for measuring or inspection of the at least one parameter of the workpiece.

10. The apparatus according to claim 9, and also comprising a control unit coupled to the measuring or inspection unit for receiving and analyzing data generated thereby.

11. The apparatus according to claim 9, wherein said measuring or inspection unit comprises:
- a radiation source for generating incident radiation;
- a detection unit; and
- a radiation directing arrangement for directing the incident radiation towards the optical head and directing radiation collected by the optical head towards the detection unit.

12. The apparatus according to claim 1, wherein said at least one parameter of the workpiece to be monitored, which is a semiconductor wafer, is a thickness of at least one of the wafer's layers.

13. A processing station for processing a substantially flat workpiece which arrives to or leaves the station in a cassette having a gap thereinside above each workpiece, the station comprising processing environment and the monitoring apparatus of claim 1 for optical monitoring the workpiece whilst inside the cassette.

14. The station according to claim 13, wherein said optical monitoring apparatus comprises a measuring or inspection unit and an optical monitoring head carried by a conveyor arm coupled to said unit, the conveyor arm conveying the optical monitoring head along three mutually perpendicular axes so as to enable insertion of the optical monitoring head into the gap and movement of the head inside the gap relative to said workpiece.

15. A chemical mechanical polishing arrangement for polishing semiconductor wafers, the arrangement comprising a polisher tool, a robot means for supplying wafers from a load cassette to the polisher tool and moving polished wafers to an unload cassette, and the monitoring apparatus of claim 1 integrated in said polishing arrangement for optically monitoring parameters of the wafers being contained in either one of the cassettes.

16. A photolithography arrangement for patterning semiconductor wafers, the arrangement comprising photolithography tools, a robot means for supplying wafers from a load cassette, translating the wafers between the photolithography tools and moving the patterned wafers to an unload cassette, and the monitoring apparatus of claim 1 for optically monitoring parameters of the wafers being contained in either one of the cassettes.

17. An CVD arrangement for processing semiconductor wafers, the arrangement comprising a deposition unit, a robot means for supplying wafers from a load cassette to the deposition unit and moving the processed wafers to an unload cassette, and the monitoring apparatus of claim 1 for optically monitoring parameters of the wafers being contained in either one of the cassettes.

18. The arrangement according to claim 15, wherein said monitoring parameters includes thickness of at least one of the wafer's layers.

19. The arrangement according to claim 16, wherein said monitoring parameter includes thickness of at least one of the wafer's layers.

20. The arrangement according to claim 17, wherein said monitoring parameter includes thickness of at least one of the wafer's layers.

21. An optical monitoring apparatus for monitoring parameters of a substantially flat workpiece contained in a cassette in a manner defining a gap thereinside above the workpiece, the apparatus comprising a measuring unit located outside said cassette and an optical head carried by a distal end of a conveyor arm coupled to the measuring unit, the conveyor arm conveying the optical head along three mutually perpendicular axes relative to the cassette, the distal end of the conveyor arm and the monitoring head being configured so as to be insertable into the gap above the workpiece to be monitored and to be movable inside said gap relative to said workpiece, said optical monitoring apparatus being thereby configured for monitoring the workpiece while in the cassette.

22. A method for monitoring workpieces while located in a cassette in a spaced-apart relationship with a gap above each of the workpieces, the method comprising: mounting a monitoring head on a distal end of a conveyor arm, the distal end and the monitoring being configured so as to be insertable into the gap above the workpiece to be monitored; and driving the conveyor arm for movement along three mutually perpendicular axes so as to bring the monitoring head to the respective gap, insert the monitoring head into said gap and move the monitoring head within said gap relative to the respective workpiece.

* * * * *